United States Patent
Cheng

(10) Patent No.: US 6,661,072 B1
(45) Date of Patent: Dec. 9, 2003

(54) PIEZOELECTRIC CERAMIC TRANSISTOR

(75) Inventor: Eddie Cheng, Hsin-Tien (TW)

(73) Assignee: Shin Jiuh Corp. (TW)

( * ) Notice: Subject to any disclaimer, the term of this patent is extended or adjusted under 35 U.S.C. 154(b) by 0 days.

(21) Appl. No.: 10/158,870

(22) Filed: Jun. 3, 2002

(51) Int. Cl.$^7$ .......................... H01L 31/00; H05B 41/00; H03H 27/42
(52) U.S. Cl. ...................... 257/431; 315/324; 315/224; 323/356; 323/355
(58) Field of Search ............................ 257/431; 438/48, 438/65; 310/316, 317, 359; 323/355, 356, 282; 363/133; 315/224, 324, 276, 307, DIG. 5, DIG. 7

(56) References Cited

U.S. PATENT DOCUMENTS 5,942,835 A * 8/1999 Furuhashi et al. ..... 310/316.01
6,028,398 A * 2/2000 Kawasaki et al. .......... 315/224

* cited by examiner

Primary Examiner—David Nelms
Assistant Examiner—Long Tran
(74) Attorney, Agent, or Firm—Birch, Stewart, Kolasch & Birch, LLP

(57) ABSTRACT

A piezoelectric ceramic transistor is formed from a single-layered or multi-stacked layers piezoelectric ceramic voltage transformer and a capacitor, the capacitor being series connected to an input terminal of the piezoelectric ceramic voltage transformer to prevent electric power and prevent loss due to feedback, thereby compensating and increasing vibrations of the piezoelectric ceramic voltage transformer. Alternatively, the above connection scheme is achieved by either serial connecting a capacitor between a power output of the transformer and a load terminal, or parallel connecting a first capacitor to a power input of the transformer while a second capacitor is series connected between a power output of the transformer and the load terminal to obtain an increased power and thereby increasing the load current.

6 Claims, 6 Drawing Sheets

PIEZOELECTRIC CERAMIC TRANSISTOR

FIELD OF THE INVENTION

The invention relates to a piezoelectric ceramic transistor. More particularly, the invention provides an electric element that is suitable for use in piezoelectric converter device, and can increase electric power.

BACKGROUND OF THE INVENTION

As shown in the schematic views of FIG. 1 and FIG. 2, present driving devices for driving cold cathode fluorescent lamp (CCFL) comprises a driving device and a CCFL driven by the driving device. The driving device comprises a power supply unit 1, a pulse width modulation (PWM) control unit 2, a driving unit 3, and a piezoelectric ceramic voltage transformer 4'. The CCFL 7 connects to the PWM 2 through a current feedback 5 and the piezoelectric ceramic voltage transformer 4' connects to the PWM 2 through the voltage feedback 6. When this driving device is turned on and inputs a voltage, the driving unit 3 immediately drives the piezoelectric ceramic voltage transformer 4' that in turn drives the illumination of the CCFL 7 via piezoelectric ceramic reverse effect. The PWM control unit 2 then detects the average output current intensity of the CCFL 7 through current feedback 5 to output a resonance frequency. The resonance frequency via the control unit 3 and the piezoelectric ceramic voltage transformer 4' can control the average current of the CCFL 7. Hence, the light source generated from the CCFL 7 is projected on the semi-transparent back panel to illuminate the back panel and match the display frame of the LCD screen. Because the illumination of the CCFL 7 via driving of the above driving device is limited or uniform, several CCFL 7 are therefore needed to obtain a uniform back panel illumination of the LCD screen. As a result, the fabrication cost is increased, and the fabrication process further is not easily achieved.

SUMMARY OF THE INVENTION

It is therefore an object of the invention to provide a piezoelectric ceramic transistor that can overcome the above problems by being fabricated from a single-layered or multi-stacked layers piezoelectric ceramic voltage transformer that has an input terminal series connected to a capacitor. The above capacitor thereby forms a bypass capacitor that increases the power and prevents a loss due to feedback so that vibrations of the piezoelectric ceramic voltage transformer are compensated. Alternatively, the above connection scheme is achieved by either serial connecting a capacitor between a power output of the transformer and a load terminal, or parallel connecting a first capacitor to a power input of the transformer while a second capacitor is series connected between a power output of the transformer and the load terminal to obtain an increased power and thereby increasing the load current.

Another object of the invention is to provide a piezoelectric ceramic transistor that is formed either via the connection of traditionally known electric elements or via semiconductor packaging into a single element.

Furthermore, another object of the invention is to provide a piezoelectric ceramic transistor that can reduce the number of CCFL mounted to the LCD screen so that the fabrication is facilitated and the fabrication cost reduced.

Still, another object of the invention is to provide a piezoelectric ceramic transistor that can allow CCFL with higher power or of longer length, or CCFL drive with lower driving voltage.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
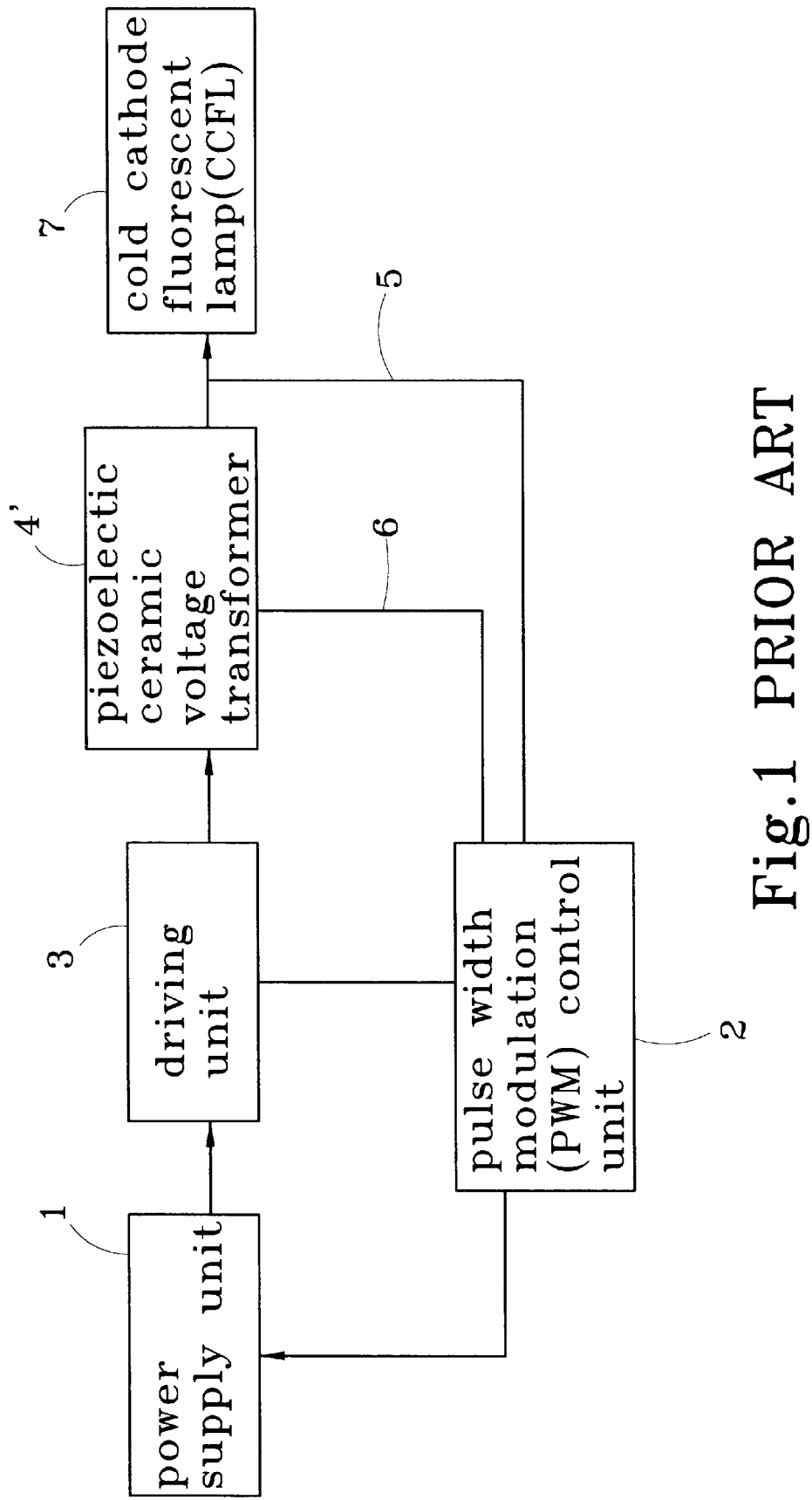
FIG. 1 is a block diagram illustrating a background light source driving circuit of LCD screen.
Figure 2:
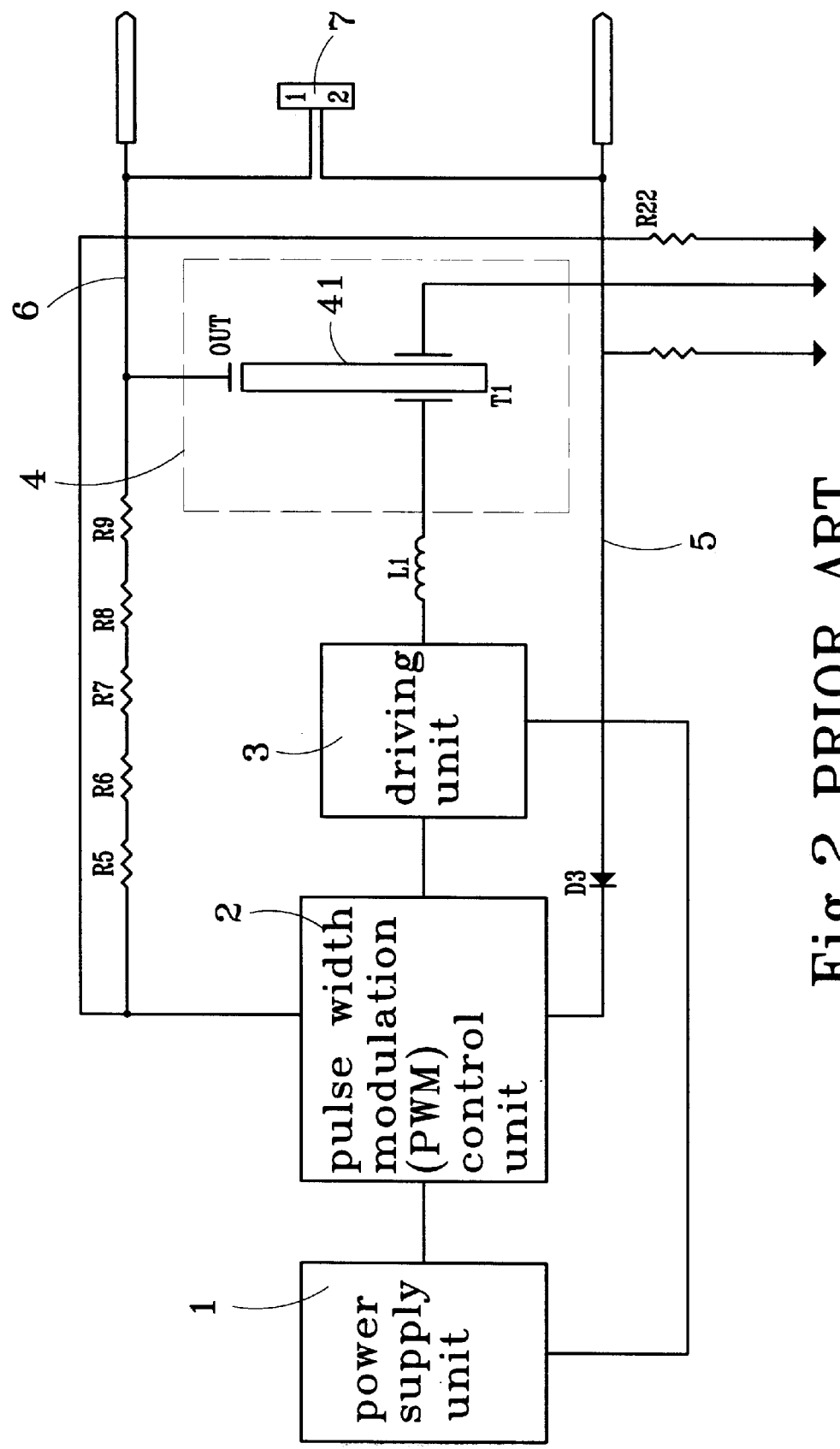
FIG. 2 illustrates a corresponding circuit of the block diagram of FIG. 1.

Wherever possible in the following description, like reference numerals will refer to like elements and parts unless otherwise illustrated.

Figure 3:
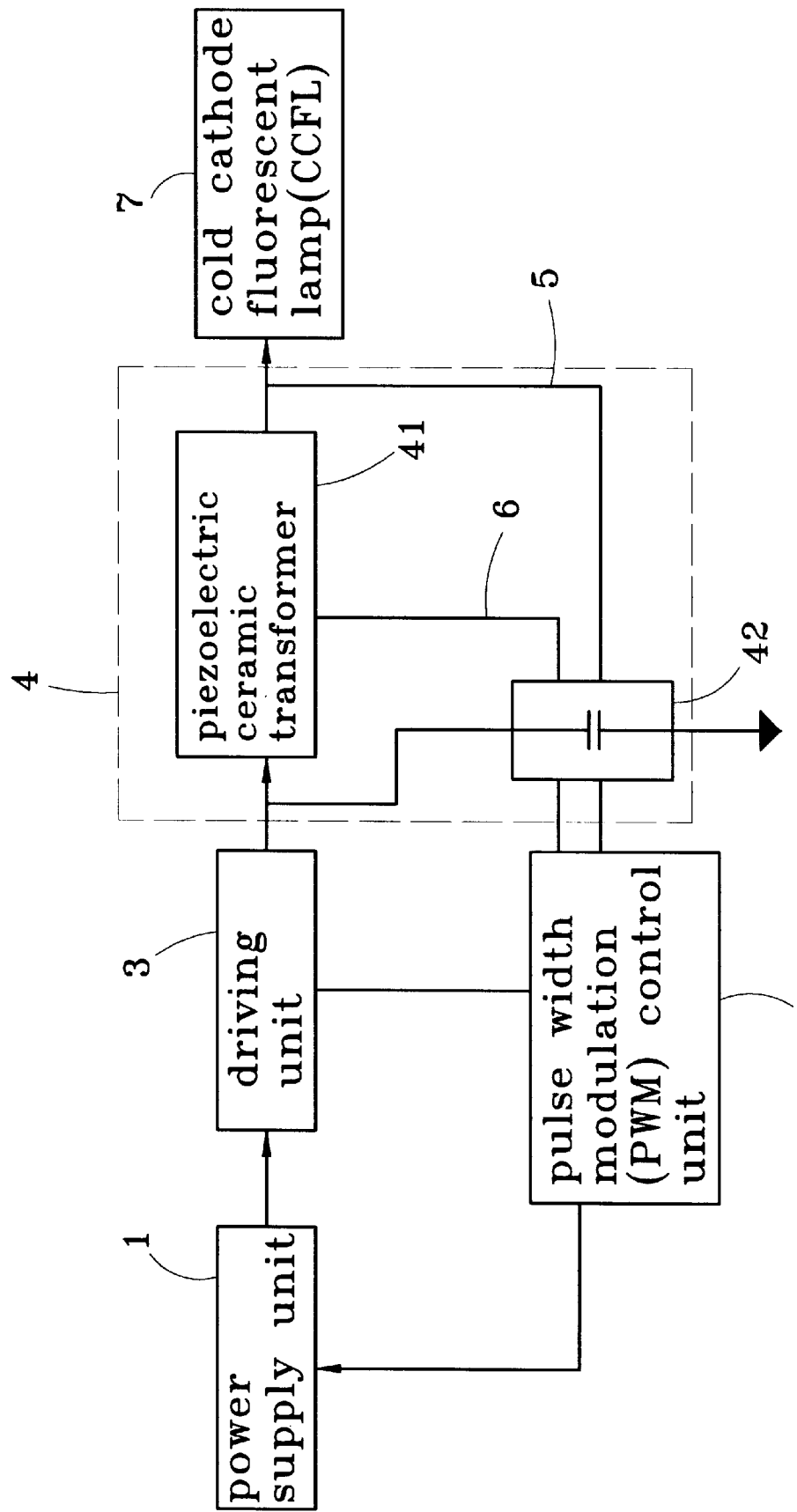
FIG. 3 is a block diagram of an implementation circuit according to an embodiment of the invention.
Figure 4:
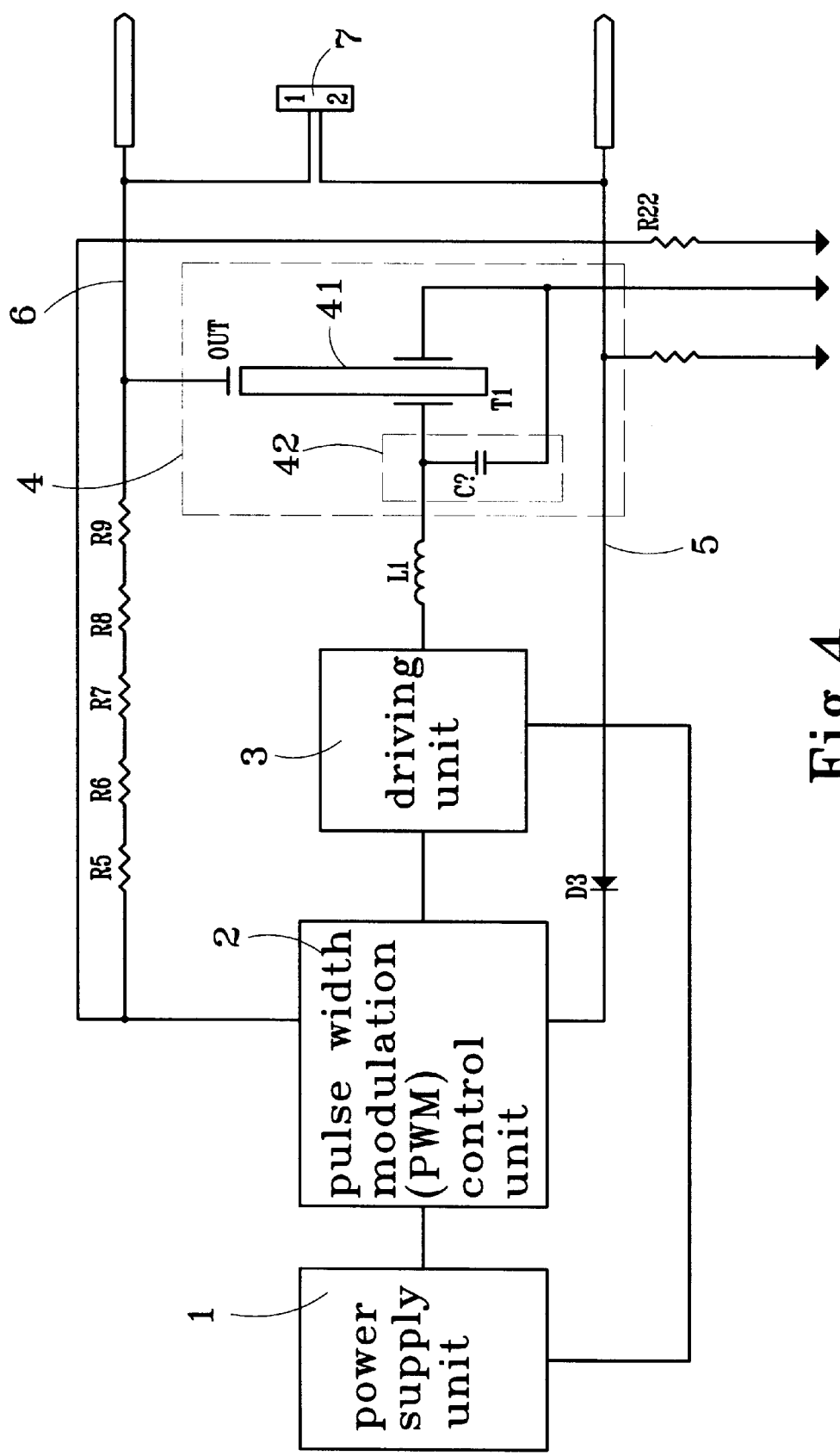
FIG. 4 is a circuit diagram corresponding to the block diagram of FIG. 3.

Referring to FIG. 3 and FIG. 4, two block diagrams schematically illustrate an implementation circuit according to an embodiment of the invention. As illustrated, the piezoelectric ceramic transistor of the invention is principally formed via serial connecting a capacitor to an input terminal of a single-layered or multi-stacked layers piezoelectric ceramic voltage transformer (piezoelectric layer). A LCD screen driving device is illustrated as an example of embodiment of the invention. This driving device comprises a power supply unit 1, a pulse width modulation (PWM) control unit 2, a driving unit 3, and a piezoelectric ceramic transistor 4. Constructed as above, the driving device is used to drive a cold cathode fluorescent lamp (CCFL) 7 that produces a light source for the back-light of the LCD. The power supply unit 1 provides power necessary for the operation of all the units of the driving device.

The PWM control unit 4 is connected to an input terminal of the driving unit 3, and respectively receives a current feedback 5 from the CCFL 7 and a voltage feedback 6 from the piezoelectric ceramic transistor 4. From the current feedback 5 and according to the average current intensity detected from the output of the CCFL 7, the PWM control unit 4 adequately controls the average current of the CCFL 7.

The driving unit 3 has an input connected to the PWM control unit 2, and receives a resonance frequency outputted from the PWM control unit 2.

The piezoelectric ceramic transistor 4 is formed by a capacitor 42 parallel connected to an input terminal of a piezoelectric ceramic transformer 41. The capacitor 42 hence forms a bypass capacitor, which allows to obtain a higher power. The capacitor 42 can prevent loss due to feedback, and contributes to compensate the vibration of the piezoelectric ceramic transistor 41.

When the driving device is turned on, the driving unit 3 immediately drives the piezoelectric ceramic transistor 4 that in turn drives the CCFL 7 for illumination operation. At this moment, the PWM control unit 2 measures the average current intensity outputted from the CCFL 7 through the current feedback 5, and outputs a resonance frequency. The resonance frequency is delivered to the driving unit 3 and piezoelectric ceramic transistor 4 to control the average current of the CCFL 7.

The examples of connection of the capacitor to the single-layered or multi-stacked layers piezoelectric ceramic transformer are illustrated hereafter.

I. Single-layered Piezoelectric Ceramic Transformer

A. Testing Conditions:
 1. V(DCV): 14V±5%
 2. load: lamp length 220 mm
 3. working frequency: 66 KHz 2 KHz
 4. light regulation conditions: DCV 0V
 5. single-layered piezoelectric ceramic transformer: 48 mm L×8 mm W×1.8 mm t
 6. static capacitance of low voltage terminal: 1.25 nf
 7. number of layers of input terminal: 1 layer
 8. testing temperature: 27±10%

B. Test Results:
 Without capacitor: tube voltage (RMS) acV: 30V; tube current (AVG) mAacI: 0 mA;
 With capacitor: tube voltage (RMS) acV: 567V; tube current (AVG) mAacI: 6.729 mA.

C. Testing Efficiency:
 1. without capacitor tube voltage (RMS)acV×tube current (AVG)mAacI=P_out(w)

30V×0 mA=0W input voltage (DCV)×input current (DCI)=P_IN

14V×0.036A=0.5W 2. with parallel capacitor tube voltage (RMS)acV×tube current (AVG)mAacI=P_out(w)

576V×0.6729 mA=3.81W input voltage (DCV)×input current (DCI)=P_IN

14V×1.268A=17.72W

As shown in the above test results, the addition of the capacitor of 0.127 uf can turn on the single-layered piezoelectric ceramic transformer. The problem related to the requisite use of a step-up voltage transformer to first step-up voltage before driving the single-layered piezoelectric ceramic transformer can be thereby improved. The fabrication process hence is facilitated, and the fabrication cost is reduced.

II. Multi-stacked Layers Piezoelectric Ceramic Transformer

A. Testing Conditions:
 1. V(DCV): 12V±5%
 2. load: lamp length 220 mm
 3. working frequency: 73.39 KHz 2 KHz
 4. light regulation conditions: DCV 0V
 5. multi-stacked layers piezoelectric ceramic transformer ±10%: 48 mm L×8 mm W×1.8 mm t
 6. static capacitance of low voltage terminal: 82.9 nf
 7. number of layers of input terminal: 18 layers
 8. testing temperature: 27±10%

B. Test Results:
 Without capacitor: tube voltage (RMS) acV: 500V; tube current (AVG) mAacI: 6.86 mA;
 With capacitor: tube voltage (RMS) acV: 475V; tube current (AVG) mAacI: 13.186 mA.

C. Testing Efficiency:
 1. without capacitor tube voltage (RMS)acV×tube current (AVG)mAacI=P_out(w)

500V×6.86 mA=3.43W input voltage (DCV)×input current (DCI)=P_IN

12V×0.378A=4.53W 2. with parallel capacitor tube voltage (RMS)acV×tube current (AVG)mAacI=P_out(w)

475V×13.186 mA=6.25W input voltage (DCV)×input current (DCI)=P_IN

12V×0.882A=10.58W

As shown in the above test results, the addition of the capacitor of 0.1 uf can turn on the multi-stacked layers piezoelectric ceramic transformer.

Figure 5:
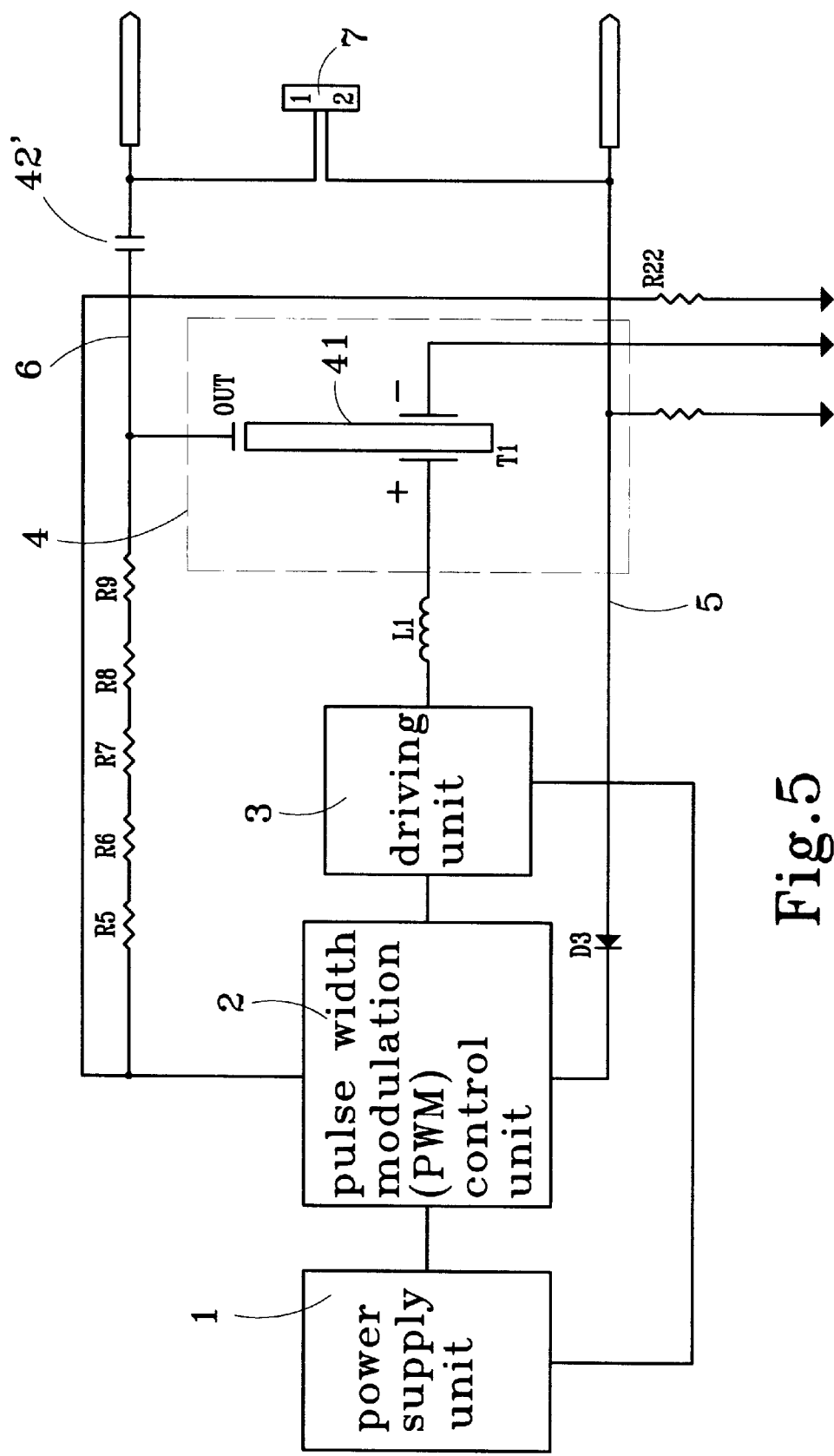
FIG. 5 is a block diagram illustrating another embodiment of the invention.

FIG. 5 illustrates another embodiment of the invention. As illustrated, besides parallel connecting the capacitor 42 to the input terminal of the transformer 41, it can be also envisaged to serial connect a capacitor 42' between the output terminal of the transformer 41 and the load (CCFL) 7 to magnify the outputted voltage and, thereby, increase the power.

Figure 6:
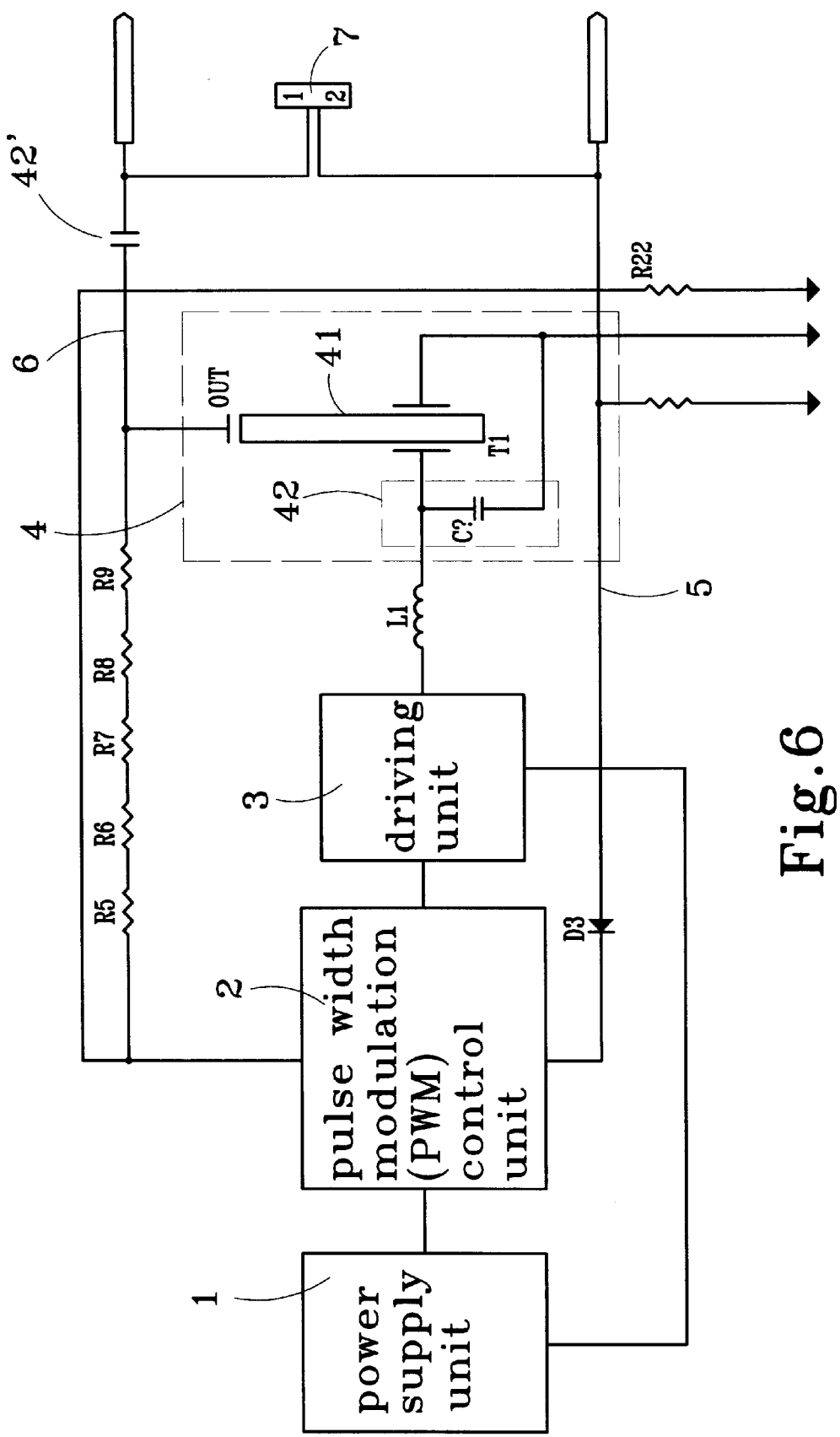
FIG. 6 is a block diagram still illustrating another embodiment of the invention.

FIG. 6 still illustrates another variant embodiment of the invention. As shown, the capacitor 42 can be parallel connected to the input terminal of the transformer 41 while being also serial connected between the output terminal of the transformer 41 and the load (CCFL) 7 to magnify the outputted voltage and, thereby, increase the power.

The following results compare a scheme connection in which the piezoelectric ceramic voltage transformer is not connected to any capacitors and connection schemes in which a capacitor is serial connected between the output terminal and the load terminal, or different capacitors are simultaneously parallel and serial connected between the input terminal and the output terminal of the piezoelectric ceramic voltage transformer A. Testing Conditions:
 1. V(DCV): 1.12V±5%
 2. load: lamp length 220 mm×1 unit
 3. working frequency: 74 KHz 2 KHz
 4. light regulation conditions: DCV 0V
 5. single layer piezoelectric ceramic transformer: 42 mm L×7.4 mm W×3.7 mm t
 6. static capacitance of low voltage terminal: 185 nf
 7. number of layers of input terminal: 18 layers
 8. testing temperature: 27±10%
 9. capacitors: 100 pF, 68 nF B. Test Results:
 Without capacitor: tube current (AVG) mAacI: 7.21 mA;
 With a capacitor of 100 pF serial connected to the output terminal: tube current (AVG) mAacI: 8.25 mA.

With a capacitor of 100 pF serial connected to the output terminal and a capacitor of 68 nF parallel connected to the input terminal: tube current (AVG) mAacI: 10.83 mA.

From the above results, it is observed that the lamp current outputted can be increased via either serial connecting a capacitor to the output terminal of the transformer, or serial connecting a first capacitor to the output of the transformer and simultaneously parallel connecting a second capacitor to the input terminal of the transformer.

The invention as described above is advantageous allowing the reduction of the number of lamps 7 mounted to the LCD screen. Alternatively, with respect to the same conditions of input and load, the corresponding input voltage of the driving device can be also reduced. Thereby, the number of electric components can be also reduced. By further reducing the volume and number of layers of the piezoelectric transformer, the fabrication cost is reduced, and the fabrication process is simpler.

Furthermore, the invention is also advantageous allowing a single piezoelectric ceramic transistor 4 element to be formed from the piezoelectric ceramic transformer 41 and the capacitor 42, 42' via semiconductor packaging process. Alternatively, the piezoelectric ceramic transformer 41 and the capacitor 42 can be connected via traditional electric elements.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A piezoelectric ceramic transistor, suitable for use in piezoelectric converter device, comprising a piezoelectric ceramic voltage transformer and a capacitor, the capacitor being parallel connected to an input terminal of the piezoelectric ceramic voltage transformer to form a bypass capacitor, thereby the power is increased and loss due to feedback is prevented so that vibrations of the piezoelectric ceramic voltage transformer are compensated.

2. The transistor of claim 1, wherein the piezoelectric ceramic voltage transformer and the capacitor are connected to each other via traditional electric element to form a piezoelectric ceramic transistor with increased power.

3. The transistor of claim 1, wherein the piezoelectric ceramic voltage transformer and the capacitor are processed via semiconductor packaging to form a single piezoelectric ceramic transistor.

4. The transistor of claim 1, wherein the piezoelectric ceramic transistor provides either a cold cathode fluorescent lamp (CCFL) with higher driving power or a CCFL of longer length.

5. A piezoelectric ceramic transistor, suitable for use in piezoelectric converter device, comprising a piezoelectric ceramic voltage transformer and a capacitor, the capacitor being serial connected between an output terminal of the piezoelectric ceramic voltage transformer and a load terminal, thereby magnifying an output voltage and increasing the power.

6. A piezoelectric ceramic transistor, suitable for use in piezoelectric converter device, comprising a piezoelectric ceramic voltage transformer and at least a first and a second capacitor, wherein the first capacitor being parallel connected to an input terminal of the piezoelectric ceramic voltage transformer and between an output terminal of the piezoelectric ceramic voltage transformer and a load terminal so as to form a bypass capacitor used to increase the power and prevent a loss due to a feedback, thereby compensating vibrations of the piezoelectric ceramic voltage transformer; while the second capacitor being serial connected between the output terminal of the piezoelectric ceramic voltage transformer and the load terminal, thereby respectively increasing an output voltage and the power.

* * * * *